(12) United States Patent
Sekiya

(10) Patent No.: US 10,522,503 B2
(45) Date of Patent: Dec. 31, 2019

(54) METHOD OF MANUFACTURING STACKED WAFER ASSEMBLY

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/124,788

(22) Filed: Sep. 7, 2018

(65) Prior Publication Data

US 2019/0081021 A1   Mar. 14, 2019

(30) Foreign Application Priority Data

Sep. 13, 2017   (JP) ................. 2017-175836

(51) Int. Cl.
- *H01L 23/00* (2006.01)
- *H01L 23/544* (2006.01)
- *H01L 21/78* (2006.01)

(52) U.S. Cl.
CPC .............. *H01L 24/83* (2013.01); *H01L 21/78* (2013.01); *H01L 23/544* (2013.01); *H01L 24/32* (2013.01); *H01L 24/94* (2013.01); *H01L 2223/5446* (2013.01); *H01L 2224/32145* (2013.01); *H01L 2224/83143* (2013.01); *H01L 2224/83851* (2013.01)

(58) Field of Classification Search
CPC ....................................................... H01L 23/00
See application file for complete search history.

(56) References Cited

FOREIGN PATENT DOCUMENTS

| JP | 2009004406 A | 1/2009 |
|---|---|---|
| JP | 2012204589 A | 10/2012 |

*Primary Examiner* — Marvin Payen
(74) *Attorney, Agent, or Firm* — Greer Burns & Crain Ltd.

(57) ABSTRACT

A stacked wafer assembly is made by forming a grid of grooves corresponding to projected dicing lines in a face side of each of two wafers, thereby forming demarcated areas on the face side of each of the two wafers. One of the wafers is installed with demarcated areas face upwardly, and thereafter liquid is supplied to the demarcated areas in a quantity just enough to stay on upper surfaces of the demarcated areas without overflowing. The other wafer is placed over the one wafer with demarcated areas of the other wafer facing the respective demarcated areas of the one wafer, thereby bringing respective central positions of the facing demarcated areas of the wafers into self-alignment with each other under the surface tension of the liquid sandwiched between the facing demarcated areas. The liquid is removed to bring the wafers into intimate contact with each other.

4 Claims, 17 Drawing Sheets

METHOD OF MANUFACTURING STACKED WAFER ASSEMBLY

BACKGROUND OF THE INVENTION

Field of the Invention

The present invention relates to a method of manufacturing a stacked wafer assembly.

Description of the Related Art

In recent years, there have been put to practical use stacked semiconductor devices in which a plurality of semiconductor devices are stacked in order to make electric appliances smaller in size and lower in profile using such stacked semiconductor devices. Various stacking processes for manufacturing stacked semiconductor devices include chip-on-chip fabrication processes and chip-on-wafer fabrication processes (see, for example, Japanese Patent Laid-open No. 2009-004406 and Japanese Patent Laid-open No. 2012-204589). Furthermore, wafer-on-wafer fabrication processes include a fabrication process using TSV (Through-Silicon Via), for example.

SUMMARY OF THE INVENTION

The stacking processes disclosed in Japanese Patent Laid-open No. 2009-004406 and Japanese Patent Laid-open No. 2012-204589 are highly efficient as they are capable of stacking many devices at a time. However, they are quite difficult to carry out because it is necessary to position all devices on wafers that face each other in accurate alignment with each other.

It is therefore an object of the present invention to provide a method of manufacturing a stacked wafer assembly with reduced difficulty in positioning wafers in accurate alignment with each other.

In accordance with an aspect of the present invention, there is provided a method of manufacturing a stacked wafer assembly of two wafers each having a face side on which a plurality of devices each having at least one electrode are formed in a plurality of areas demarcated by a grid of projected dicing lines on the face side, including the steps of preparing two wafers, forming a grid of grooves corresponding to respective projected dicing lines in a face or reverse side of each of the two wafers, thereby forming demarcated areas demarcated by the grooves on the face or reverse side of each of the two wafers, installing one of the wafers with the demarcated areas formed on the face or reverse side thereof in place such that the demarcated areas face upwardly, and thereafter supplying a liquid to the demarcated areas of the one of the wafers in a quantity just enough to stay on upper surfaces of the demarcated areas without overflowing therefrom, placing the other of the wafers over the one of the wafers such that the demarcated areas of the other of the wafers face the respective demarcated areas of the one of the wafers which have been supplied with the liquid, thereby bringing respective central positions of the facing demarcated areas of the wafers into self-alignment with each other under the surface tension of the liquid sandwiched between the facing demarcated areas, and thereafter, removing the liquid to bring the other of the wafers into intimate contact with the one of the wafers.

Preferably, the step of removing the liquid includes the step of installing limiters against outer circumferential surfaces of the wafers that have been superposed one over the other for thereby preventing the wafers from shifting in in-plane directions.

Preferably, the step of removing the liquid includes the steps of charging the wafers that have been superposed one over the other into a decompression chamber, and evacuating the decompression chamber to reduce the pressure therein for evaporating the liquid.

Preferably, each of the devices has a plurality of electrodes, and the step of removing the liquid includes the step of connecting the electrodes of the devices on the one of the wafers and the electrodes of the devices on the other of the wafers to each other.

With the method of manufacturing a stacked wafer assembly according to the present invention, since the two wafers are positioned into self-alignment with each other under the surface tension of the liquid, the two wafers can be positioned into self-alignment with each other with reduced difficulty.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will be described in detail below with reference to the drawings. The present invention is not limited to the details of the preferred embodiments described below. The components described below cover those which could easily be envisaged by those skilled in the art and those which are essentially identical to those described below. Furthermore, the arrangements described below can be used in appropriate combinations. Various omissions, replacements, or changes of the arrangements may be made without departing from the scope of the present invention.

First Embodiment

Figure 1:
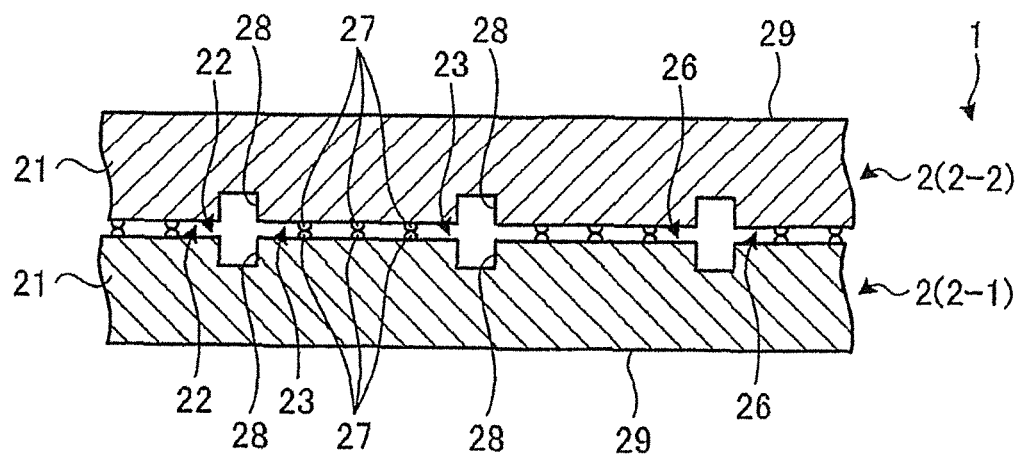
FIG. 1 is a fragmentary cross-sectional view of a stacked wafer assembly manufactured by a method of manufacturing a stacked wafer assembly according to a first embodiment of the present invention.
Figure 2:
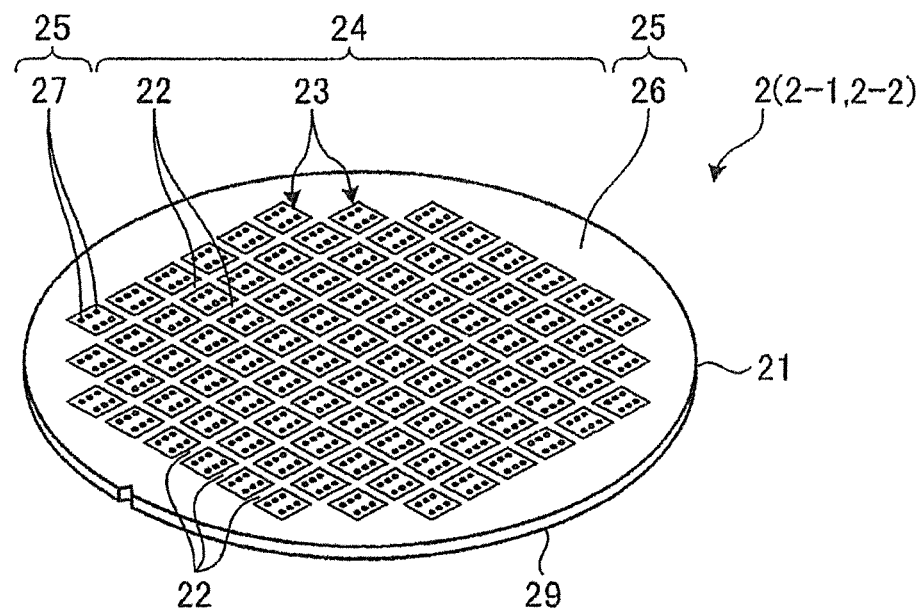
FIG. 2 is a perspective view of a wafer of the stacked wafer assembly depicted in FIG. 1.
Figure 3:
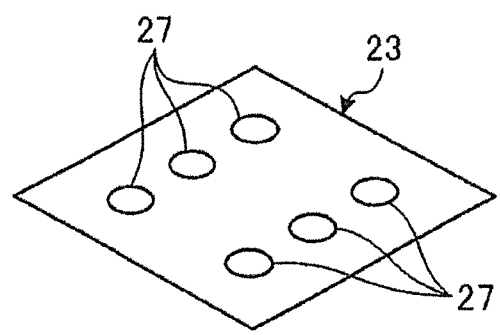
FIG. 3 is a perspective view of a device on the wafer depicted in FIG. 2.

A method of manufacturing a stacked wafer assembly according to a first embodiment of the present invention will be described below with reference to the drawings. FIG. 1 is a fragmentary cross-sectional view of a stacked wafer assembly manufactured by the method of manufacturing a stacked wafer assembly according to the first embodiment of the present invention. FIG. 2 is a perspective view of a wafer of the stacked wafer assembly depicted in FIG. 1. FIG. 3 is a perspective view of a device on the wafer depicted in FIG. 2.

The method of manufacturing a stacked wafer assembly according to the first embodiment will be illustrated as a method of manufacturing a stacked wafer assembly 1 depicted in FIG. 1. The stacked wafer assembly 1 depicted in FIG. 1 is made up of two wafers 2 each depicted in FIG. 2. According to the first embodiment, the wafer 2 depicted in FIG. 2 is a disk-shaped semiconductor wafer or optical wafer having a substrate 21 made of silicon, sapphire, gallium arsenide, or the like. The wafer 2 has on a face side 26 thereof a device region 24 where a plurality of devices 23 are formed in a plurality of areas demarcated by a grid of projected dicing lines 22 and an outer peripheral extra region 25 surrounding the device region 24 and free of devices 23. As depicted in FIGS. 2 and 3, each of the devices 23 has a plurality of bumps 27 serving as electrodes projecting from a surface thereof.

According to the first embodiment, the stacked wafer assembly 1 includes two wafers 2 each having a grid of grooves 28 (see FIG. 5) corresponding to the projected dicing lines 22, the wafers 2 being fixed to each other such that their face sides 26 face each other and the bumps 27 of the devices 23 on the wafers 2 are held in contact with each other. The wafers 2 are fixed to each other by a resin functioning as an adhesive that bond together at least either the substrates 21 of the wafers 2 or the devices 23 on the wafers 2. Alternatively, the wafers 2 may be fixed to each other by an electrically conductive adhesive that bond together the bumps 27 of the devices 23 on the wafers 2.

Figure 4:
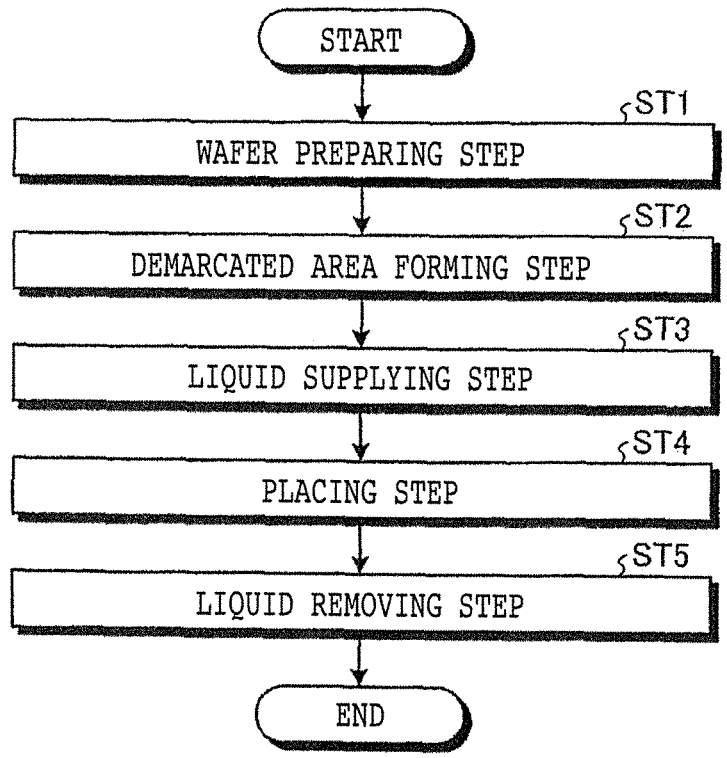
FIG. 4 is a flowchart of a processing sequence of the method of manufacturing a stacked wafer assembly according to the first embodiment.

The method of manufacturing a stacked wafer assembly according to the first embodiment will be described below. FIG. 4 is a flowchart of a processing sequence of the method of manufacturing a stacked wafer assembly according to the first embodiment. The method of manufacturing a stacked wafer assembly according to the first embodiment will be illustrated as a method of manufacturing the stacked wafer assembly 1 made up of the two wafers 2. As depicted in FIG. 4, the method includes a wafer preparing step ST1, a demarcated area forming step ST2, a liquid supplying step ST3, a placing step ST4, and a liquid removing step ST5.

(Wafer Preparing Step)

The wafer preparing step ST1 is a step of preparing a wafer 2 depicted in FIG. 2. In the wafer preparing step ST1, two wafers 2 each depicted in FIG. 2 are prepared.

(Demarcated Area Forming Step)

Figure 5:
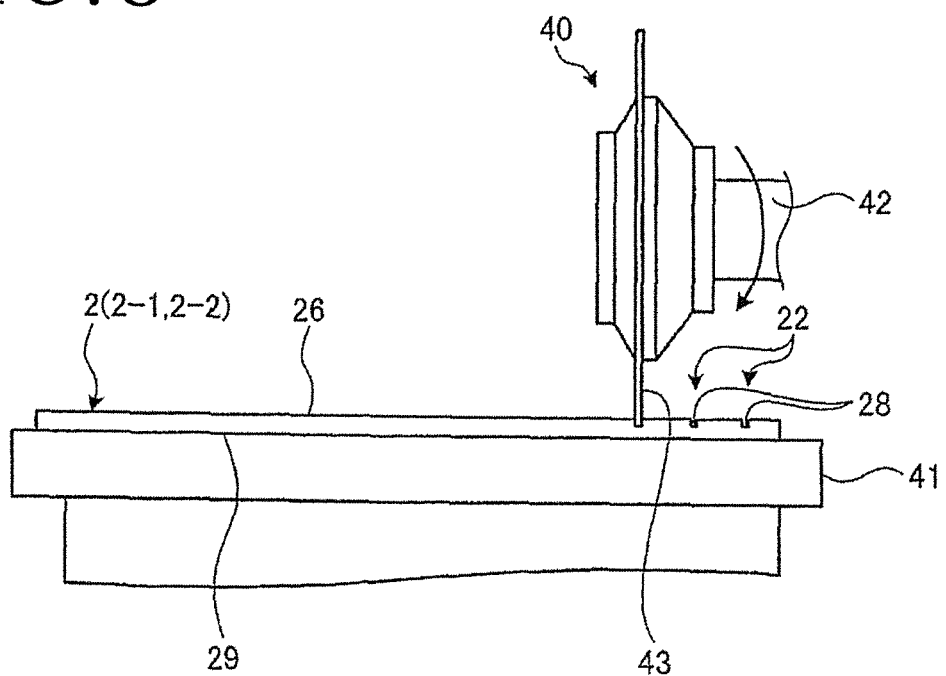
FIG. 5 is a side elevational view illustrating a demarcated area forming step of the method of manufacturing a stacked wafer assembly depicted in FIG. 4.
Figure 6:
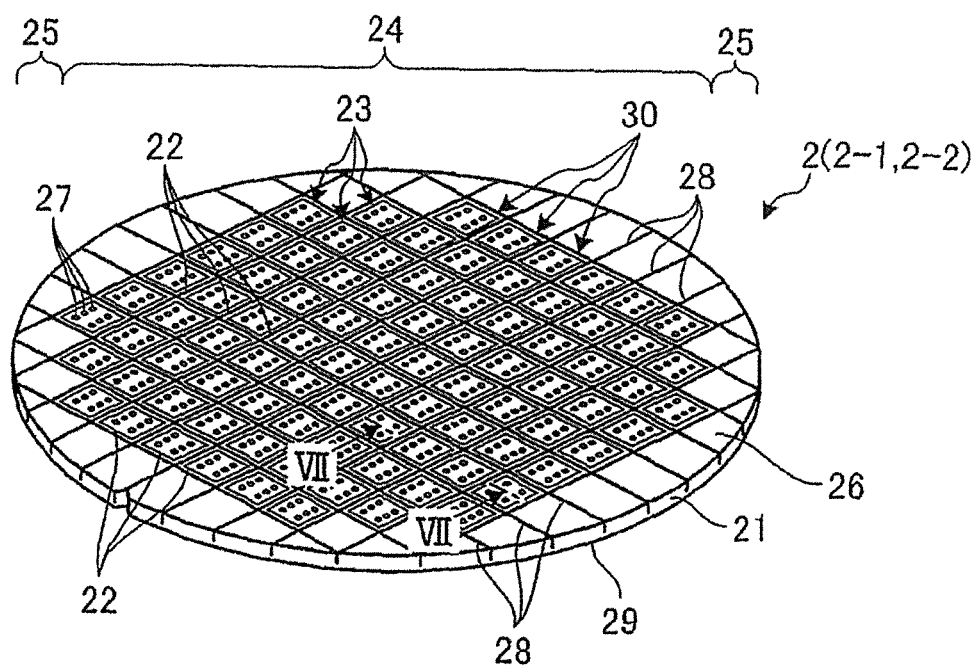
FIG. 6 is a perspective view of the wafer after the demarcated area forming step of the method of manufacturing a stacked wafer assembly depicted in FIG. 4.
Figure 7:
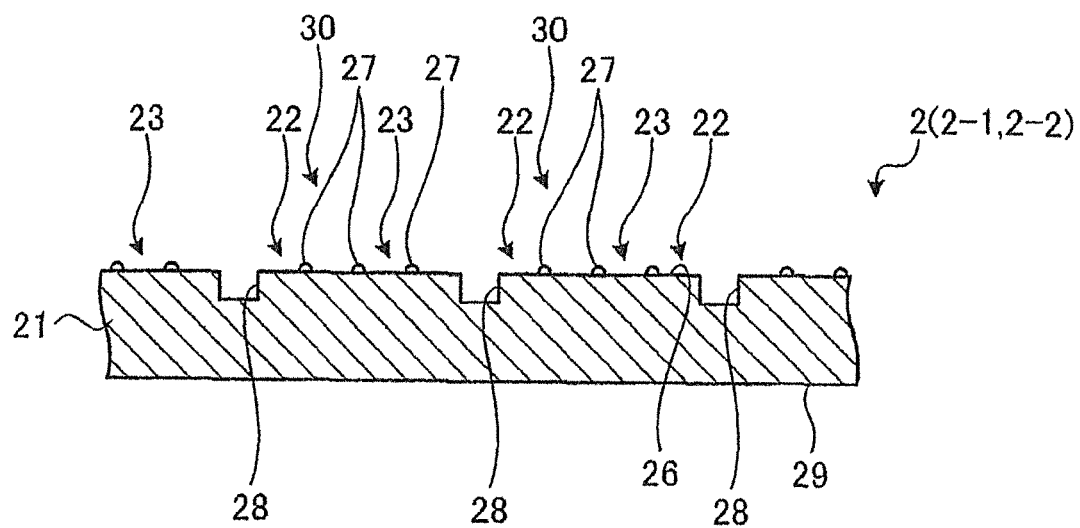
FIG. 7 is a cross-sectional view taken along line VII-VII of FIG. 6.

FIG. 5 is a side elevational view illustrating a demarcated area forming step of the method of manufacturing a stacked wafer assembly depicted in FIG. 4. FIG. 6 is a perspective view of the wafer after the demarcated area forming step of the method of manufacturing a stacked wafer assembly depicted in FIG. 4. FIG. 7 is a cross-sectional view taken along line VII-VII of FIG. 6.

The demarcated area forming step ST2 is a step of forming a grid of grooves 28, which correspond to the respective projected dicing lines 22, in the face sides 26 of the two wafers 2, thereby forming a plurality of demarcated areas 30 that are demarcated on the face sides 26 of the respective wafers 2 by the grooves 28. In the demarcated area forming step ST2, a cutting apparatus 40 depicted in FIG. 5 is used to form the grooves 28 successively in the two wafers 2 prepared in the wafer preparing step ST1.

In the demarcated area forming step ST2, for forming the grooves 28 in each of the two wafers 2, a reverse side 29 of the wafer 2 is held under suction on a chuck table 41 of the cutting apparatus 40, as depicted in FIG. 5. Then, a cutting blade 43 that is being rotated by a spindle 42 is caused to cut into the wafer 2 to a depth short of the reverse side 29 while the cutting blade 43 and the wafer 2 held on the chuck table 41 are being moved relatively to each other along the projected dicing lines 22.

In the demarcated area forming step ST2, as depicted in FIGS. 6 and 7, the cutting blade 43 that has thus cut into the wafer 2 forms the grooves 28 in the wafer 2 along the respective projected dicing lines 22, the grooves 28 extending from the face side 26 to a depth short of the reverse side 29 to thereby form demarcated areas 30 between the adjacent ones of the grooves 28 on the face side 26. According to the first embodiment, the demarcated areas 30 are formed in the device region 24 in the demarcated area forming step ST2. Demarcated areas 30 may be or may not be formed in the outer peripheral extra region 25. Therefore, according to the first embodiment, the demarcated areas 30 formed in the demarcated area forming step ST2 contain the respective devices 30. After the grooves 28 have been formed in each of the two wafers 2 along all the projected dicing lines 22, the liquid supplying step ST3 is carried out.

(Liquid Supplying Step)

Figure 8:
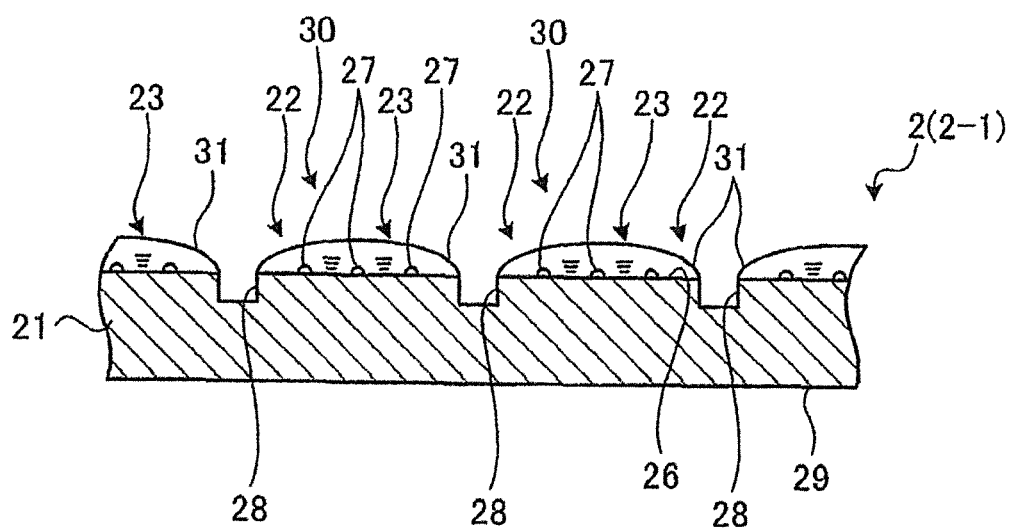
FIG. 8 is a fragmentary cross-sectional view of the wafer after a liquid supplying step of the method of manufacturing a stacked wafer assembly depicted in FIG. 4.

FIG. 8 is a fragmentary cross-sectional view of the wafer 2 after a liquid supplying step of the method of manufacturing a stacked wafer assembly depicted in FIG. 4.

The liquid supplying step ST3 is a step of installing one (hereinafter indicated by 2-1) of the two wafers 2 each with the demarcated areas 30 formed on its face side 26 in place, such the demarcated areas 30 face upwardly, and supplying a liquid 31 to the demarcated areas 30 in a quantity just enough to stay on the demarcated areas 30 without overflowing from the upper surfaces of the demarcated areas 30. In the liquid supplying step ST3, the reverse side 29 of one wafer 2-1 on which the grooves 28 and the demarcated areas 30 have been formed in the demarcated area forming step ST2 is secured in place with the face side 26 being exposed upwardly, and a liquid supplying nozzle, not depicted, is positioned over the face side 26 of one wafer 2-1.

In the liquid supplying step ST3, the liquid supplying nozzle supplies the liquid 31 successively to the surfaces of the demarcated areas 30. In the liquid supplying step ST3, the liquid supplying nozzle supplies the liquid 31 successively to the surfaces of the demarcated areas 30 in a quantity just enough to be kept on the demarcated areas 30 and not flowing into the grooves 28, i.e., prevented from flowing into the grooves 28, due to surface tension. In other words, in the liquid supplying step ST3, the liquid supplying nozzle supplies the liquid 31 successively to the surfaces of the demarcated areas 30 in a quantity just enough to stick to only the demarcated areas 30 due to surface tension. According to the first embodiment, in the liquid supplying step ST3, the liquid supplying nozzle supplies pure water as the liquid 31. According to the present invention, however, the liquid supplying nozzle may supply an adhesive or an underfill as the liquid 31 especially when the bumps 27 on the two wafers 2 are to be connected to each other. After the liquid 31 has been supplied to the surfaces of all the demarcated areas 30 of one wafer 2-1, the placing step ST4 is carried out as depicted in FIG. 8.

(Placing Step)

Figure 9:
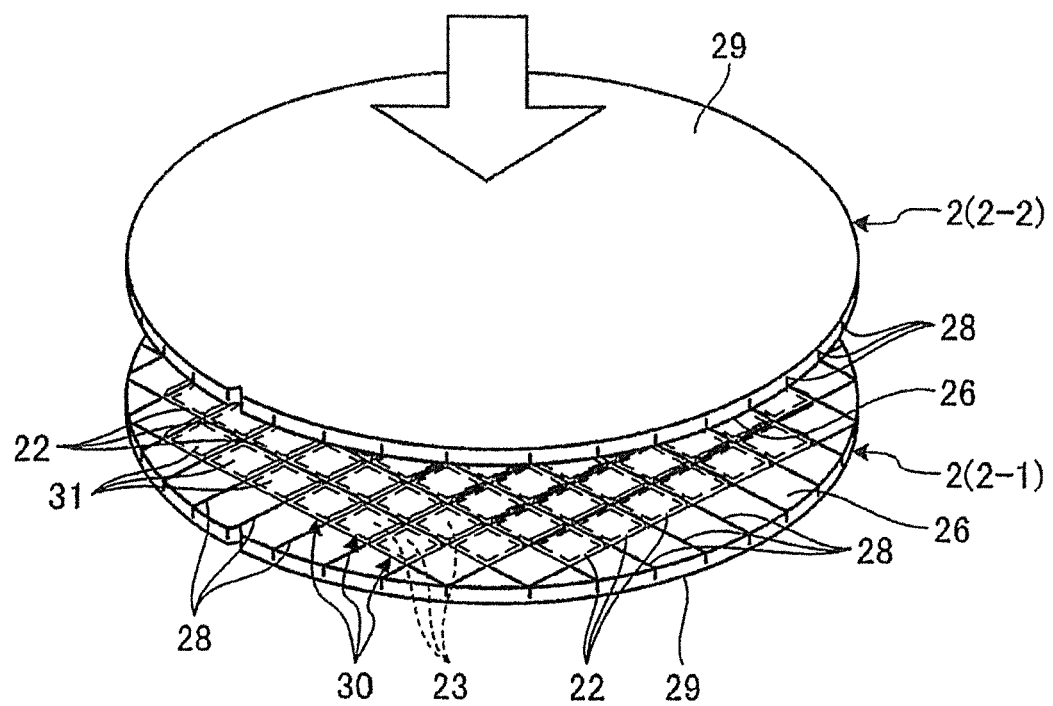
FIG. 9 is a perspective view illustrating a placing step of the method of manufacturing a stacked wafer assembly depicted in FIG. 4.
Figure 10:
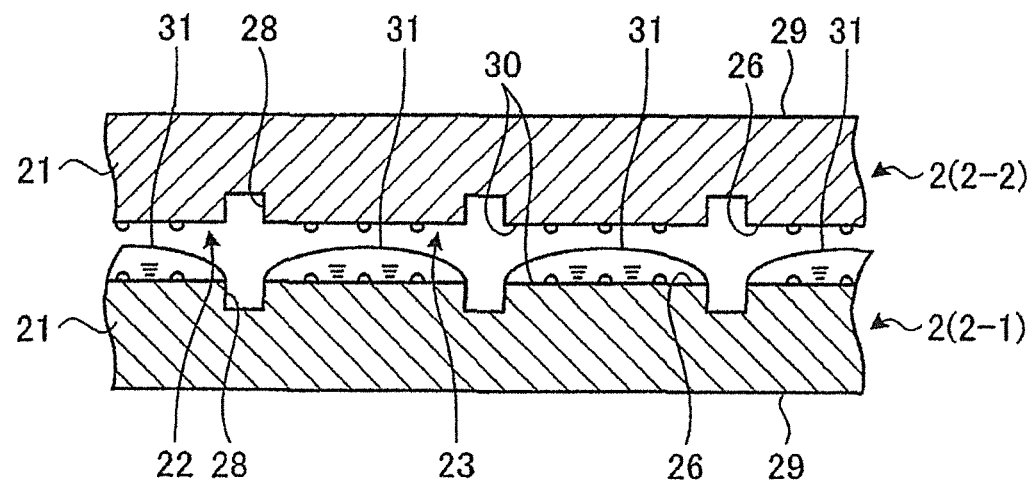
FIG. 10 is a fragmentary cross-sectional view of the wafers depicted in FIG. 9.
Figure 11:
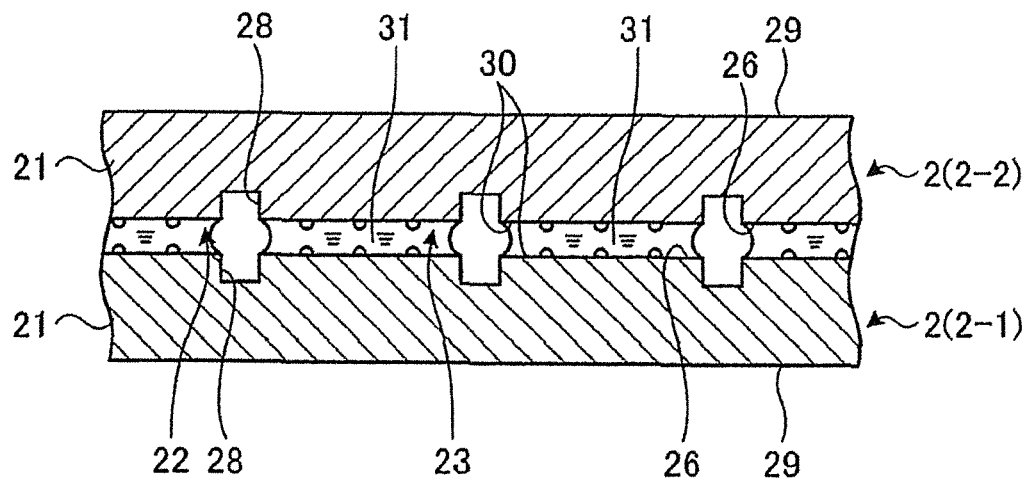
FIG. 11 is a fragmentary cross-sectional view of the wafers after the placing step of the method of manufacturing a stacked wafer assembly depicted in FIG. 4.

FIG. 9 is a perspective view illustrating a placing step of the method of manufacturing a stacked wafer assembly depicted in FIG. 4. FIG. 10 is a fragmentary cross-sectional view of the wafers depicted in FIG. 9. FIG. 11 is a fragmentary cross-sectional view of the wafers after the placing step of the method of manufacturing a stacked wafer assembly depicted in FIG. 4.

The placing step ST4 is a step of placing the other wafer (hereinafter indicated by 2-2) over one wafer 2-1 with the demarcated areas 30 of the wafer 2-2 facing the respective demarcated areas 30 of one wafer 2-1 that have been supplied with the liquid 31, bringing the central positions of the demarcated areas 30 of the wafers 2-1 and 2-2 into alignment with each other of their own accord, i.e., due to a self-aligning action, under the surface tension of the liquid 31 sandwiched therebetween. In the placing step ST4, the reverse side 29 of one wafer 2-1 where the surfaces of the demarcated areas 30 have been supplied with the liquid 31 is secured in place with the face side 26 being exposed upwardly, and the two wafers 2-1 and 2-2 are superposed one over the other with a clearance being left thicknesswise therebetween, with the demarcated areas 30 of the wafer 2-2 facing the respective demarcated areas 30 of one wafer 2-1.

In the placing step ST4, the demarcated areas 30 of the wafer 2-2 are superposed over the respective demarcated areas 30 of one wafer 2-1. At this time, the demarcated areas 30 of the wafer 2-2 are brought into contact with the liquid 31 on the surfaces of only the corresponding demarcated areas 30 of one wafer 2-1, but not with the liquid 31 on the surfaces of the other demarcated areas 30 of one wafer 2-1. Then, the liquid 31 is held in contact with the demarcated areas 30 of the two wafers 2-1 and 2-2, causing the other wafer 2-2 to move of its own accord under the surface tension of the liquid 31, until the facing demarcated areas 30 of the two wafers 2-1 and 2-2 are positioned of their own accord into positions that are superposed thicknesswise in self-alignment with each other, as depicted in FIG. 11. Then, the liquid removing step ST5 is carried out.

(Liquid Removing Step)

Figure 12:
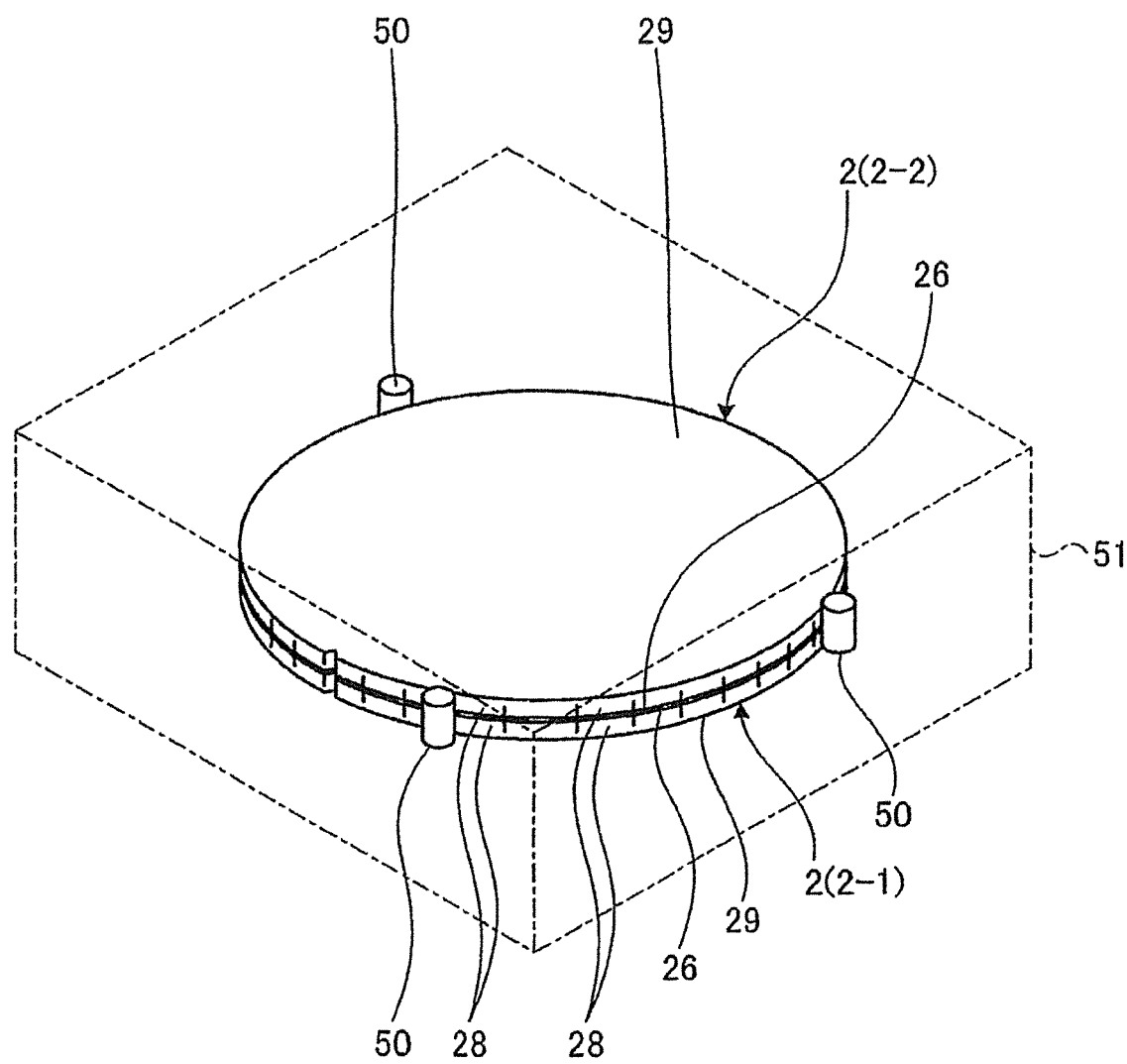
FIG. 12 is a perspective view illustrating a liquid removing step of the method of manufacturing a stacked wafer assembly depicted in FIG. 4.

FIG. 12 is a perspective view illustrating a liquid removing step of the method of manufacturing a stacked wafer assembly depicted in FIG. 4.

The liquid removing step ST5 is a step of removing the liquid 31 to hold the other wafer 2-2 in intimate contact with one wafer 2-1 after the placing step ST4. In the liquid removing step ST5, after the placing step ST4, as depicted in FIG. 12, a plurality of (three in the first embodiment) limiters 50 are installed around and against the outer circumferential surfaces of the two wafers 2-1 and 2-2 that have been superposed one over the other and positioned relatively to each other under the surface tension of the liquid 31. The limiters 50 are spaced apart from each other in the circumferential directions of the two wafers 2-1 and 2-2 and held in abutment against the outer circumferential surfaces of the two wafers 2-1 and 2-2, thereby preventing the two wafers 2-1 and 2-2 from shifting relatively to each other in directions parallel to the face side 26, i.e., in in-plane directions. In the liquid removing step ST5, therefore, the limiters 50 are installed around and against the outer circumferential surfaces of the two wafers 2-1 and 2-2.

In the liquid removing step ST5, furthermore, as depicted in FIG. 12, the superposed two wafers 2-1 and 2-2 with the limiters 50 placed therearound are charged into a decompression chamber 51, and the decompression chamber 51 is evacuated to reduce the pressure therein. In the liquid removing step ST5, when the pressure in the decompression chamber 51 is lowered, the liquid 31 is evaporated away from between the two wafers 2-1 and 2-2, causing the bumps 27 of the superposed devices 23 on the two wafers 2-1 and 2-2 to intimately contact each other, as depicted in FIG. 1. In the liquid removing step ST5, therefore, the bumps 27 on one wafer 2-1 and the bumps 27 on the other wafer 2-2 are connected to each other. The two wafers 2-1 and 2-2 are then fixed to each other by an adhesive or the like, not depicted, producing the stacked wafer assembly 1. The stacked wafer assembly 1 may be thinned by grinding at least of the two wafers 2-1 and 2-2. The stacked wafer assembly 1 may be divided into a plurality of stacked chips each including two devices 23 stacked one on the other by cutting the two wafers 2-1 and 2-2 along the projected dicing lines 22 thereon with a cutting blade or processing them with a laser beam.

With the method of manufacturing a stacked wafer assembly according to the first embodiment, since the two wafers 2-1 and 2-2 are self-aligned with each other under the surface tension of the liquid 31 supplied to the surfaces of the devices 23 in the placing step ST4, the wafers 2-1 and 2-2 are easily positioned with respect to each other. As a result, the two wafers 2-1 and 2-2 can be positioned into self-alignment with each other with reduced difficulty.

Second Embodiment

Figure 13:
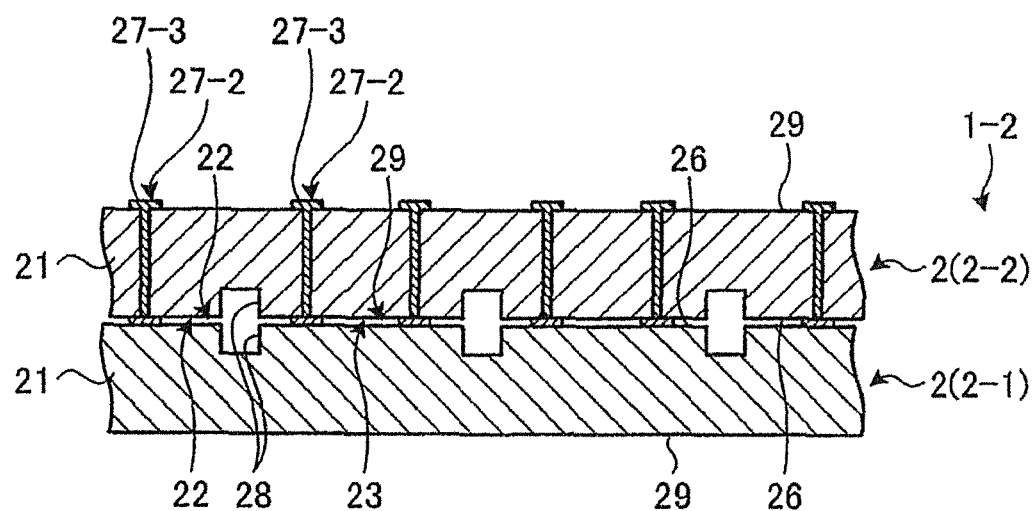
FIG. 13 is a fragmentary cross-sectional view of a stacked wafer assembly manufactured by a method of manufacturing a stacked wafer assembly according to a second embodiment of the present invention.
Figure 14:
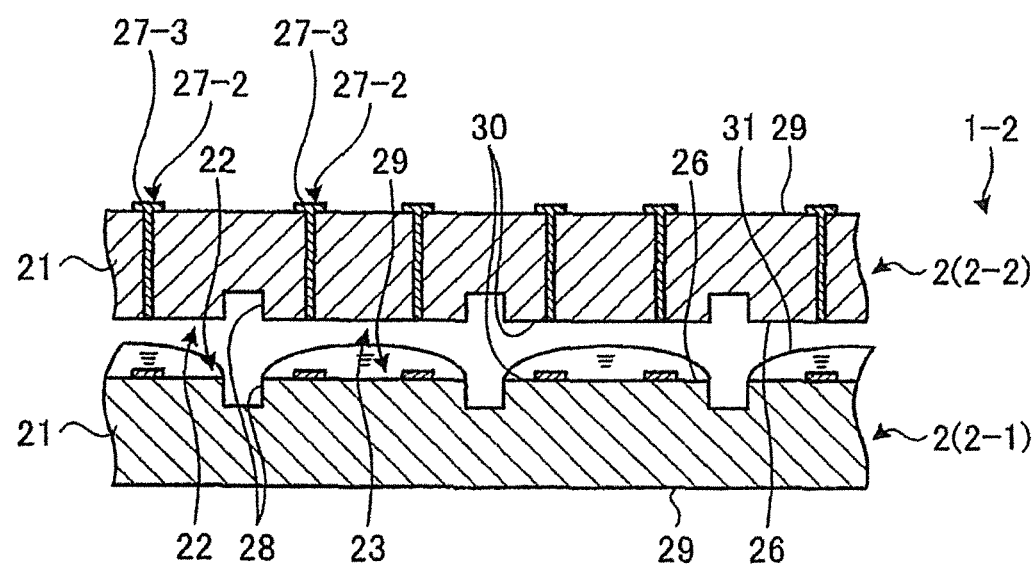
FIG. 14 is a perspective view of the wafers, illustrating a placing step of the method of manufacturing a stacked wafer assembly according to the second embodiment.
Figure 15:
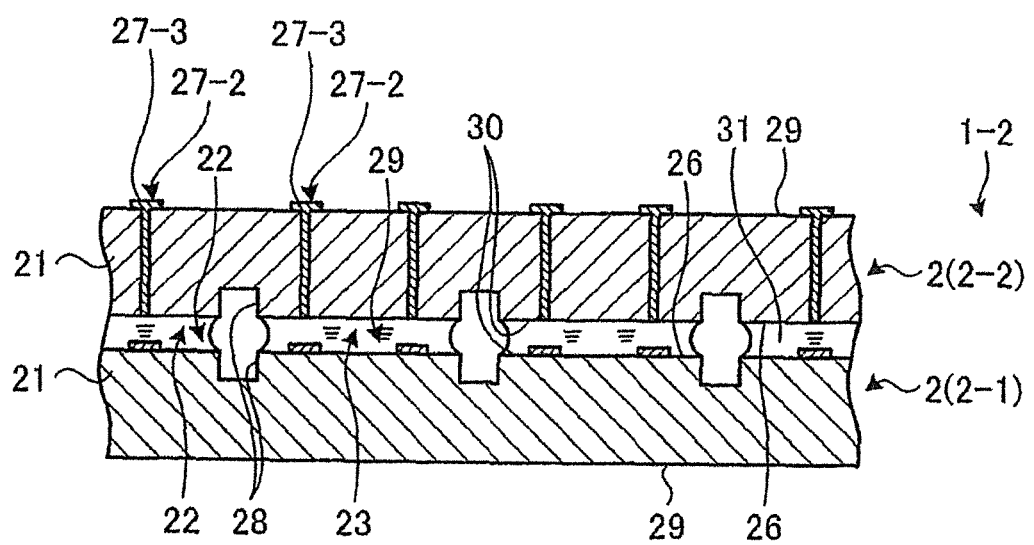
FIG. 15 is a fragmentary cross-sectional view of the wafers after the placing step of the method of manufacturing a stacked wafer assembly according to the second embodiment.

A method of manufacturing a stacked wafer assembly according to a second embodiment of the present invention will be described below with reference to the drawings. FIG. 13 is a fragmentary cross-sectional view of a stacked wafer assembly manufactured by the method of manufacturing a stacked wafer assembly according to the second embodiment of the present invention. FIG. 14 is a perspective view of the wafers, illustrating a placing step of the method of manufacturing a stacked wafer assembly according to the second embodiment. FIG. 15 is a fragmentary cross-sectional view of the wafers after the placing step of the method of manufacturing a stacked wafer assembly according to the second embodiment. Those parts depicted in FIGS. 13, 14, and 15 which are identical to those according to the first embodiment are denoted by identical reference numerals, and will not be described in detail below.

As depicted in FIG. 13, a stacked wafer assembly 1-2 manufactured by the method of manufacturing a stacked wafer assembly according to the second embodiment is made up of two wafers 2-1 and 2-2, and structurally similar to the stacked wafer assembly 1 manufactured by the method of manufacturing a stacked wafer assembly according to the first embodiment except that the wafer 2-2 has through electrodes 27-2 connected to the devices 23 on one wafer 2-1. The through electrodes 27-2 are made of metal and are of a columnar shape extending through the substrate 21 of the wafer 2-2 between the face side 26 and the reverse side 29. The through electrodes 27-2 include respective integral electrode members 27-3 projecting from the face side 26 of the wafer 2-2.

The method of manufacturing a stacked wafer assembly according to the second embodiment includes a wafer preparing step ST1, a demarcated area forming step ST2, a liquid supplying step ST3, a placing step ST4, and a liquid removing step ST5, as with the first embodiment. In the placing step ST4 of the method of manufacturing a stacked wafer assembly according to the second embodiment, as with the first embodiment, after the demarcated areas 30 of the other wafer 2-2 have been placed in facing relation to the demarcated areas 30 of one wafer 2-1, as depicted in FIG. 14, the demarcated areas 30 of the other wafer 2-2 are placed on the liquid 31 supplied to the surfaces of the demarcated areas 30 of one wafer 2-1, as depicted in FIG. 15. The demarcated areas 30 of the two wafers 2-1 and 2-2 are thus brought into mutually superposed positions aligned with each other under the surface tension of the liquid 31.

With the method of manufacturing a stacked wafer assembly according to the second embodiment, since the two wafers 2-1 and 2-2 are self-aligned with each other under the surface tension of the liquid 31 supplied to the surfaces of the devices 23 in the placing step ST4, the wafers 2-1 and 2-2 can be positioned into self-alignment with each other with reduced difficulty, as with the first embodiment.

Third Embodiment

Figure 16:
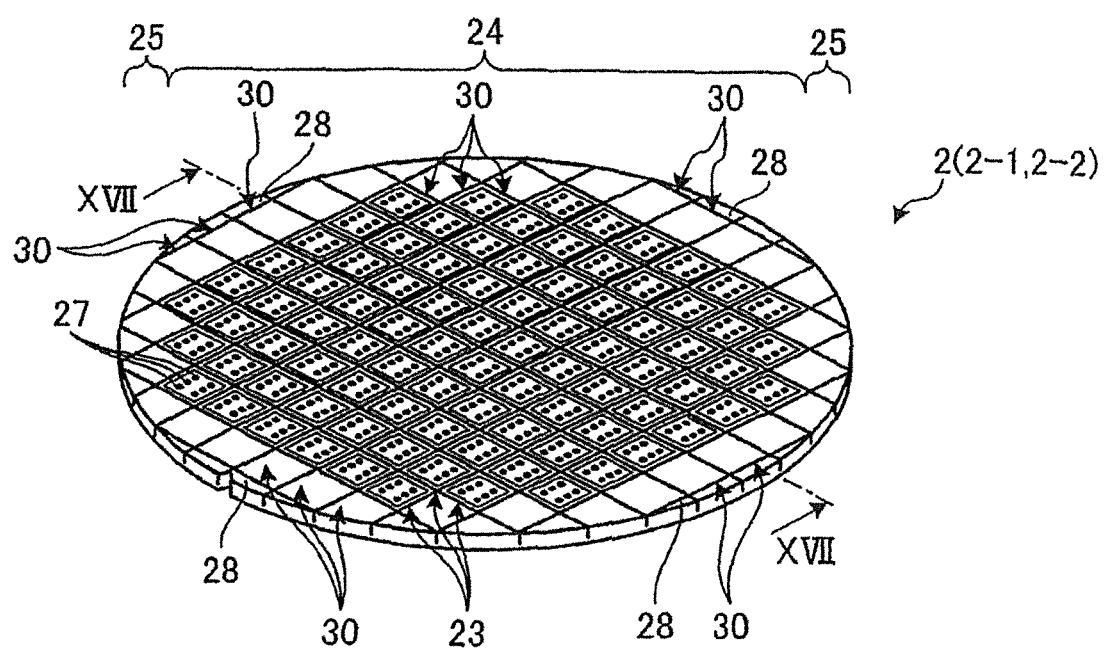
FIG. 16 is a perspective view of a wafer after a demarcated area forming step of a method of manufacturing a stacked wafer assembly according to a third embodiment of the present invention.
Figure 17:
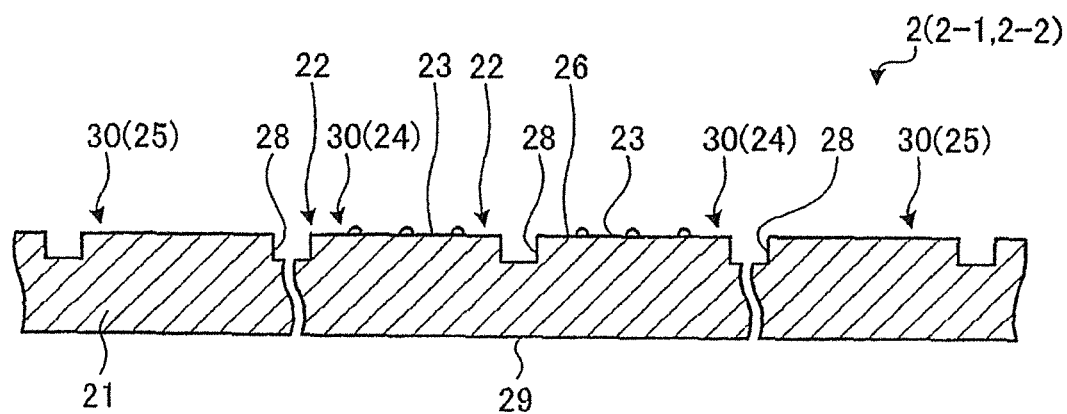
FIG. 17 is a cross-sectional view taken along line XVII-XVII of FIG. 16.
Figure 18:
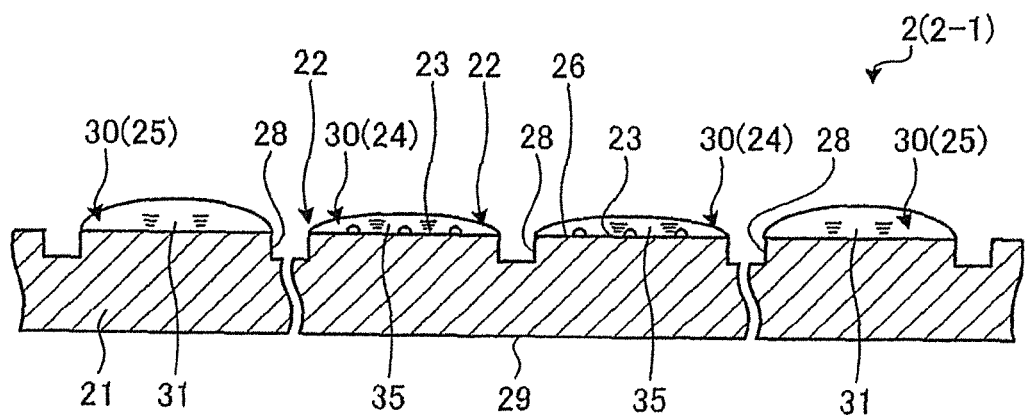
FIG. 18 is a fragmentary cross-sectional view of the wafer after a liquid supplying step of the method of manufacturing a stacked wafer assembly according to the third embodiment.
Figure 19:
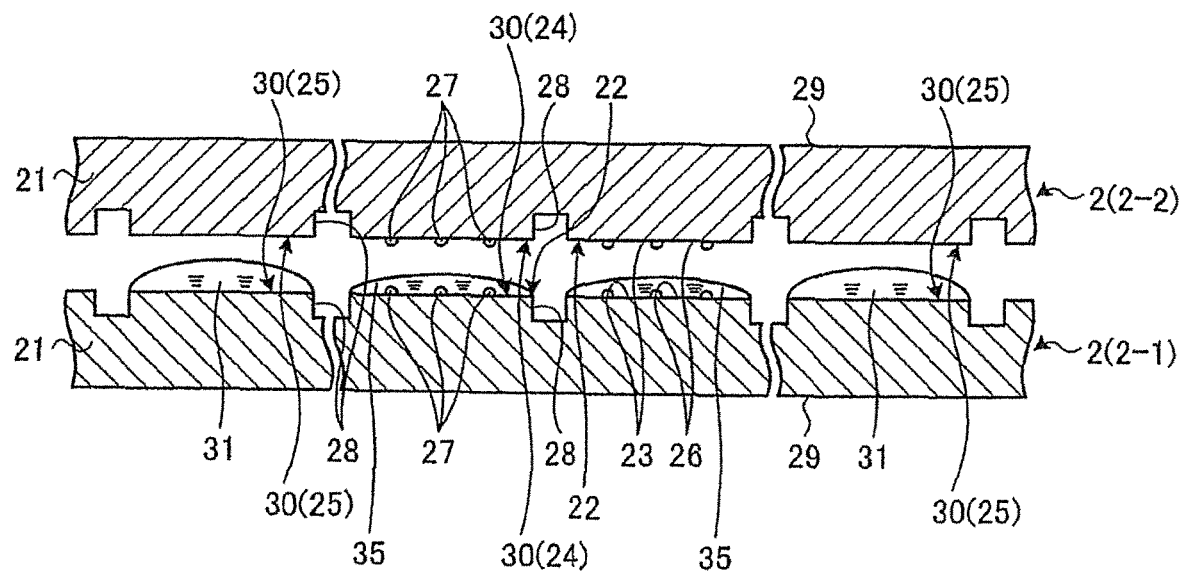
FIG. 19 is a fragmentary cross-sectional view of the wafers, illustrating a placing step of the method of manufacturing a stacked wafer assembly according to the third embodiment.
Figure 20:
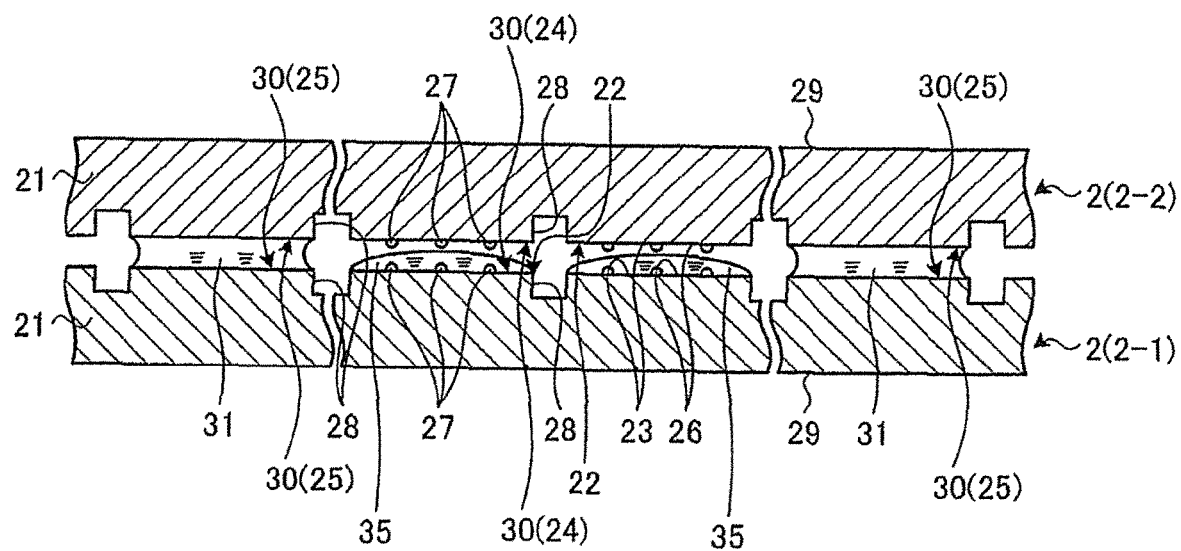
FIG. 20 is a fragmentary cross-sectional view of the wafers after the placing step of the method of manufacturing a stacked wafer assembly according to the third embodiment.
Figure 21:
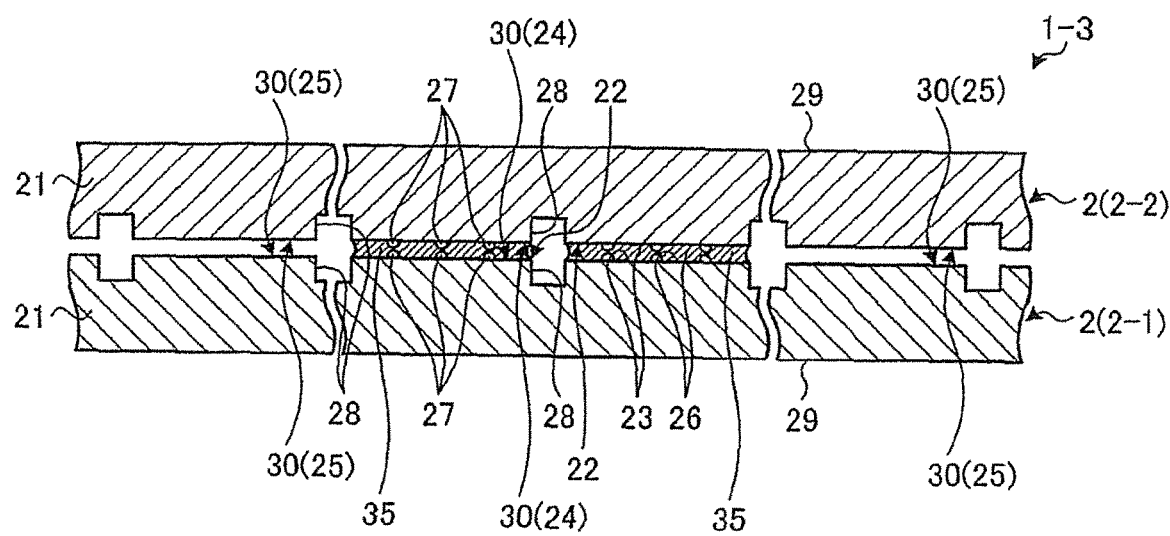
FIG. 21 is a fragmentary cross-sectional view of a stacked wafer assembly manufactured by the method of manufacturing a stacked wafer assembly according to the third embodiment.

A method of manufacturing a stacked wafer assembly according to a third embodiment of the present invention will be described below with reference to the drawings. FIG. 16 is a perspective view of a wafer after a demarcated area forming step of a method of manufacturing a stacked wafer assembly according to a third embodiment of the present invention. FIG. 17 is a cross-sectional view taken along line XVII-XVII of FIG. 16. FIG. 18 is a fragmentary cross-sectional view of the wafer after a liquid supplying step of the method of manufacturing a stacked wafer assembly according to the third embodiment. FIG. 19 is a fragmentary cross-sectional view of the wafers, illustrating a placing step of the method of manufacturing a stacked wafer assembly according to the third embodiment. FIG. 20 is a fragmentary cross-sectional view of the wafers after the placing step of the method of manufacturing a stacked wafer assembly according to the third embodiment. FIG. 21 is a fragmentary cross-sectional view of a stacked wafer assembly manufactured by the method of manufacturing a stacked wafer assembly according to the third embodiment. Those parts depicted in FIGS. 16 through 21 which are identical to those according to the first embodiment are denoted by identical reference numerals, and will not be described in detail below.

The method of manufacturing a stacked wafer assembly according to the third embodiment includes a wafer preparing step ST1, a demarcated area forming step ST2, a liquid supplying step ST3, a placing step ST4, and a liquid removing step ST5, as with the first embodiment.

In the demarcated area forming step ST2 of the method of manufacturing a stacked wafer assembly according to the third embodiment, grooves 28 parallel to the projected dicing lines 22 are formed in the outer peripheral extra regions 25 of the two wafers 2-1 and 2-2, forming demarcated areas 30 that are demarcated by the grooves 28 also in the outer peripheral extra regions 25, as depicted in FIGS. 16 and 17.

In the liquid supplying step ST3 of the method of manufacturing a stacked wafer assembly according to the third embodiment, as depicted in FIG. 18, the liquid 31 is supplied to the surfaces of the demarcated areas 30 formed in the outer peripheral extra region 25 of one wafer 2-1 of the two wafers 2-1 and 2-2, in a quantity just enough to be kept on the demarcated areas 30 and not flowing into the grooves 28, i.e., prevented from flowing into the grooves 28, due to surface tension, and no liquid 31 is supplied to the surfaces of the demarcated areas 30 in the device region 24. Furthermore, in the liquid supplying step ST3 of the method of manufacturing a stacked wafer assembly according to the third embodiment, the surfaces of the demarcated areas 30 in the device region 24 are coated with an adhesive 35. According to the present invention, however, the surfaces of the demarcated areas 30 in the device region 24 may not necessarily be coated with an adhesive 35 in the liquid supplying step ST3. According to the third embodiment, the thickness of the adhesive 35 applied to the surfaces of the demarcated areas 30 in the device region 24 is smaller than the thickness of the liquid 31 supplied to the surfaces of the demarcated areas 30 formed in the outer peripheral extra region 25. According to the present invention, however, the thickness of the adhesive 35 may be equal to or smaller than the thickness of the liquid 31.

In the placing step ST4 of the method of manufacturing a stacked wafer assembly according to the third embodiment, as with the first embodiment, after the demarcated areas 30 of the other wafer 2-2 have been placed in facing relation to the demarcated areas 30 of one wafer 2-1, as depicted in FIG. 19, the demarcated areas 30 of the other wafer 2-2 are placed on the liquid 31 supplied to the surfaces of the demarcated areas 30 of one wafer 2-1, as depicted in FIG. 20. The demarcated areas 30 of the two wafers 2-1 and 2-2 are thus brought into mutually superposed positions aligned with each other under the surface tension of the liquid 31. In the liquid removing step ST5 of the method of manufacturing a stacked wafer assembly according to the third embodiment, as with the first embodiment, the liquid 31 is removed by heating or housing the wafers 2-1 and 2-2 in the decompression chamber 51. The demarcated areas 30 in the device areas 24 of the two wafers 2-1 and 2-2 are then fixed to each other by the adhesive 35, producing a stacked wafer assembly 1-3 in which the bumps 27 on one wafer 2-1 and the bumps 27 on the other wafer 2-2 are connected to each other, as depicted in FIG. 21. According to the third embodiment, the liquid 31 is fully removed in the liquid removing step ST5. According to the present invention, however, the liquid 31 may be removed to at least such an extent that the adhesive 35 can fix the demarcated areas 30 in the device areas 24 of the two wafers 2-1 and 2-2 to each other.

With the method of manufacturing a stacked wafer assembly according to the third embodiment, since the two wafers 2-1 and 2-2 are self-aligned with each other under the surface tension of the liquid 31 in the placing step ST4, the wafers 2-1 and 2-2 can be positioned into self-alignment with each other with reduced difficulty, as with the first embodiment.

Fourth Embodiment

Figure 22:
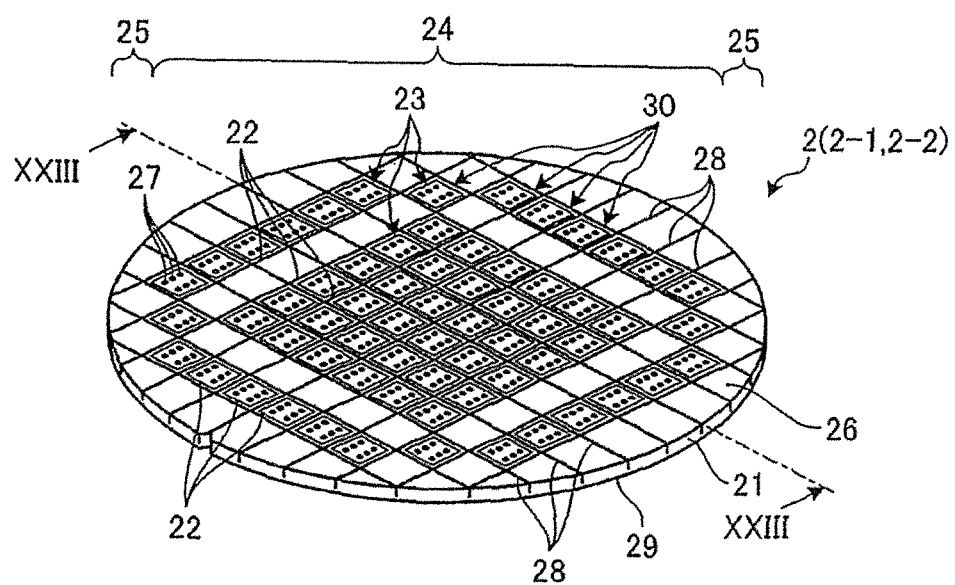
FIG. 22 is a perspective view of a wafer after a demarcated area forming step of a method of manufacturing a stacked wafer assembly according to a fourth embodiment of the present invention.
Figure 23:
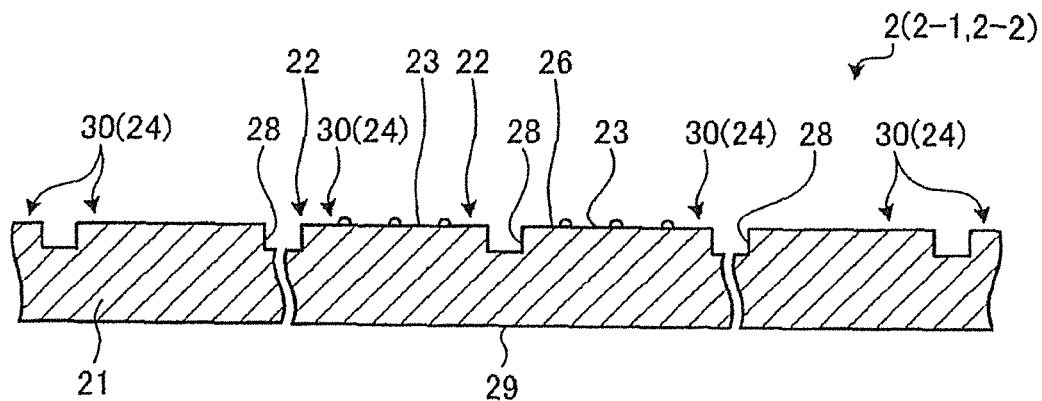
FIG. 23 is a cross-sectional view taken along line XXIII-XXIII of FIG. 22.
Figure 24:
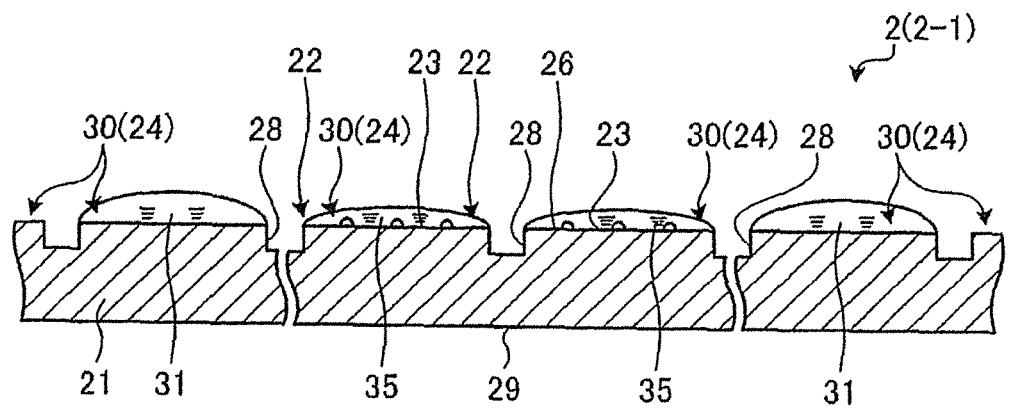
FIG. 24 is a fragmentary cross-sectional view of a wafer after a liquid supplying step of the method of manufacturing a stacked wafer assembly according to the fourth embodiment.
Figure 25:
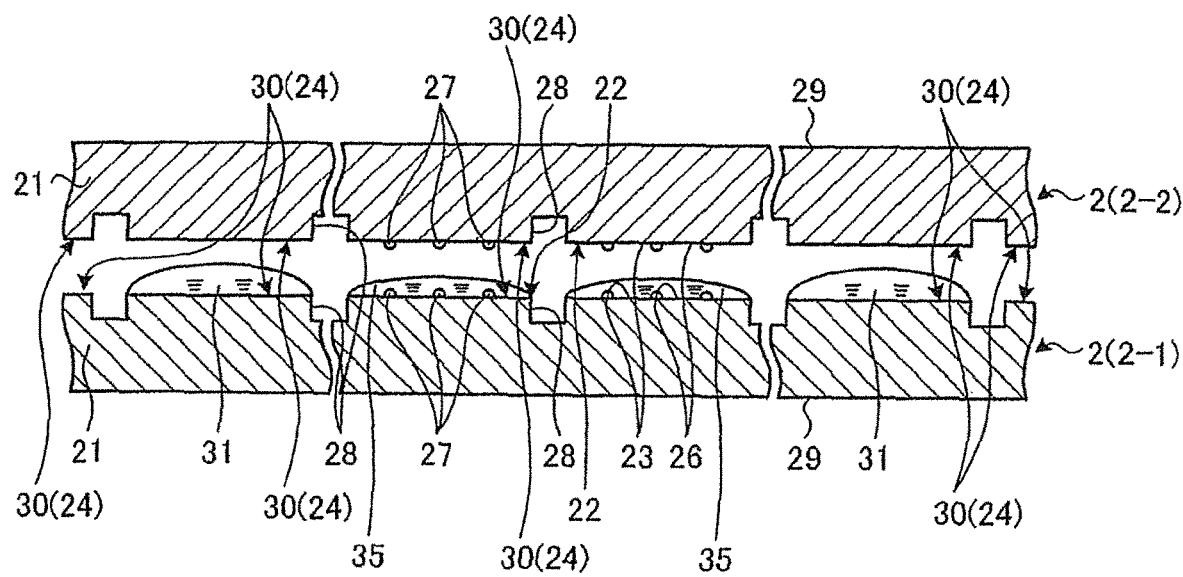
FIG. 25 is a fragmentary cross-sectional view of the wafer, illustrating a placing step of the method of manufacturing a stacked wafer assembly according to the fourth embodiment.
Figure 26:
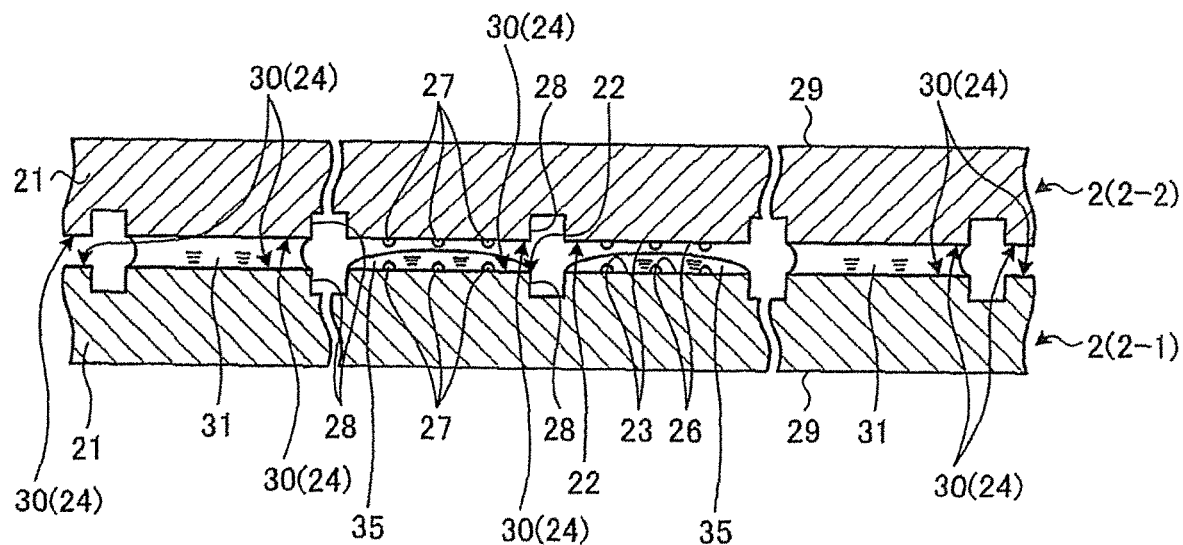
FIG. 26 is a fragmentary cross-sectional view of the wafers after the placing step of the method of manufacturing a stacked wafer assembly according to the fourth embodiment.
Figure 27:
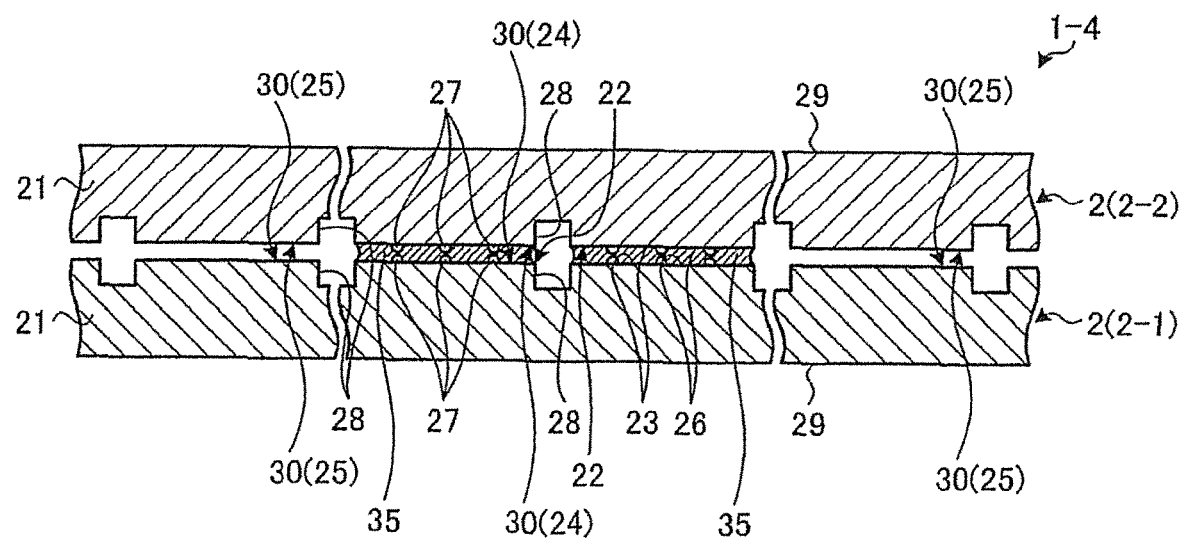
FIG. 27 is a fragmentary cross-sectional view of a stacked wafer assembly manufactured by the method of manufacturing a stacked wafer assembly according to the fourth embodiment.

A method of manufacturing a stacked wafer assembly according to a fourth embodiment of the present invention will be described below with reference to the drawings. FIG. 22 is a perspective view of a wafer after a demarcated area forming step of a method of manufacturing a stacked wafer assembly according to a fourth embodiment of the present invention. FIG. 23 is a cross-sectional view taken along line XXIII-XXIII of FIG. 22. FIG. 24 is a fragmentary cross-sectional view of a wafer after a liquid supplying step of the method of manufacturing a stacked wafer assembly according to the fourth embodiment. FIG. 25 is a fragmentary cross-sectional view of the wafer, illustrating a placing step of the method of manufacturing a stacked wafer assembly according to the fourth embodiment. FIG. 26 is a fragmentary cross-sectional view of the wafers after the placing step of the method of manufacturing a stacked wafer assembly according to the fourth embodiment. FIG. 27 is a fragmentary cross-sectional view of a stacked wafer assembly manufactured by the method of manufacturing a stacked wafer assembly according to the fourth embodiment. Those parts depicted in FIGS. 22 through 27 which are identical to those according to the first embodiment are denoted by identical reference numerals, and will not be described in detail below.

The method of manufacturing a stacked wafer assembly according to the fourth embodiment includes a wafer preparing step ST1, a demarcated area forming step ST2, a liquid supplying step ST3, a placing step ST4, and a liquid removing step ST5, as with the first embodiment.

In the wafer preparing step ST1 of the method of manufacturing a stacked wafer assembly according to the fourth embodiment, two wafers 2-1 and 2-2 are prepared in which no devices are formed in some of the areas demarcated by the grid of projected dicing lines 22 in the device area 24. In the demarcated area forming step ST2 of the method of manufacturing a stacked wafer assembly according to the fourth embodiment, as with the first embodiment, the grooves 28 are formed in the device areas 24 of the two wafers 2-1 and 2-2, forming the demarcated areas 30 that are demarcated by the grooves 28 in the device areas 24, as depicted in FIGS. 22 and 23.

In the liquid supplying step ST3 of the method of manufacturing a stacked wafer assembly according to the fourth embodiment, as depicted in FIG. 24, the liquid 31 is supplied to the surfaces of the demarcated areas 30 that are free of devices 23 in the device area 24 of one wafer 2-1 of the two wafers 2-1 and 2-2, in a quantity just enough to be kept on the demarcated areas 30 and not flowing into the grooves 28, i.e., prevented from flowing into the grooves 28, due to surface tension, and no liquid 31 is supplied to the surfaces of the demarcated areas 30 that have the devices 23 formed thereon in the device region 24. Furthermore, in the liquid supplying step ST3 of the method of manufacturing a stacked wafer assembly according to the fourth embodiment, the surfaces of the demarcated areas 30 that have the devices 23 formed thereon in the device region 24 are coated with an adhesive 35. According to the present invention, however, the surfaces of the demarcated areas 30 in the device region 24 may not necessarily be coated with an adhesive 35 in the liquid supplying step ST3. According to the fourth embodiment, the thickness of the adhesive 35 applied to the surfaces of the demarcated areas 30 that have the devices 23 formed thereon in the device region 24 is smaller than the thickness of the liquid 31 supplied to the surfaces of the demarcated areas 30 that are free of devices 23. According to the present invention, however, the thickness of the adhesive 35 may be equal to or smaller than the thickness of the liquid 31.

In the placing step ST4 of the method of manufacturing a stacked wafer assembly according to the fourth embodiment, as with the first embodiment, after the demarcated areas 30 of the other wafer 2-2 have been placed in facing relation to the demarcated areas 30 of one wafer 2-1, as depicted in FIG. 25, the demarcated areas 30 of the other wafer 2-2 are placed on the liquid 31 supplied to the surfaces of the demarcated areas 30 of one wafer 2-1, as depicted in FIG. 26. The demarcated areas 30 of the two wafers 2-1 and 2-2 are thus brought into mutually superposed positions aligned with each other under the surface tension of the liquid 31. In the liquid removing step ST5 of the method of manufacturing a stacked wafer assembly according to the fourth embodiment, as with the first embodiment, the liquid 31 is removed by heating or housing the wafers 2-1 and 2-2 in the decompression chamber 51. The demarcated areas 30 in the device areas 24 of the two wafers 2-1 and 2-2 are then fixed to each other by the adhesive 35, producing a stacked wafer assembly 1-3 in which the bumps 27 on one wafer 2-1 and the bumps 27 on the other wafer 2-2 are connected to each other, as depicted in FIG. 27. According to the fourth embodiment, the liquid 31 is fully removed in the liquid removing step ST5. According to the present invention, however, the liquid 31 may be partially removed to at least such an extent that the adhesive 35 can fix the demarcated areas 30 in the device areas 24 of the two wafers 2-1 and 2-2 to each other.

With the method of manufacturing a stacked wafer assembly according to the fourth embodiment, since the two wafers 2-1 and 2-2 are self-aligned with each other under the surface tension of the liquid 31 in the placing step ST4, the wafers 2-1 and 2-2 can be positioned into self-alignment with each other with reduced difficulty, as with the first embodiment.

[Modification]

Figure 28:
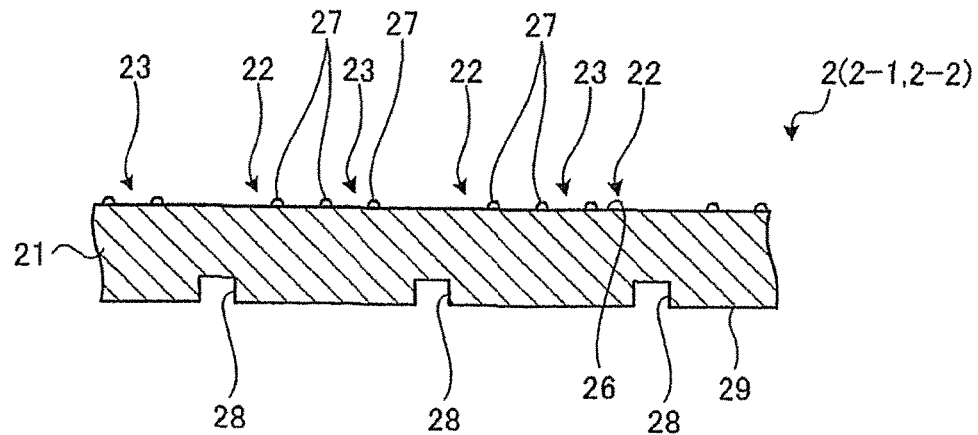
FIG. 28 is a fragmentary cross-sectional view of a wafer after a demarcated area forming step of a method of manufacturing a stacked wafer assembly according to a modification of the first through fourth embodiments.

A method of manufacturing a stacked wafer assembly according to a modification of the first through fourth embodiments will be described below with reference to the drawings. FIG. 28 is a fragmentary cross-sectional view of a wafer after a demarcated area forming step of a method of manufacturing a stacked wafer assembly according to a modification of the first through fourth embodiments. Those parts depicted in FIG. 28 which are identical to those according to the first through fourth embodiments are denoted by identical reference numerals, and will not be described in detail below.

The method of manufacturing a stacked wafer assembly according to the modification of the first through fourth embodiments is similar to the methods of manufacturing a stacked wafer assembly according to the first through third embodiments, except that grooves 28 corresponding to the projected dicing lines 22 are formed in the reverse side 29 of at least one wafer 2. The grooves 28 formed in the reverse side 29 in the demarcated area forming step ST2 of the method of manufacturing a stacked wafer assembly according to the modification are formed at positions that are superposed thicknesswise on the projected dicing lines 22 on the reverse side 29.

With the method of manufacturing a stacked wafer assembly according to the modification, since the two wafers 2-1 and 2-2 are self-aligned with each other under the surface tension of the liquid 31 supplied to the surfaces of the devices 23 in the placing step ST4, the wafers 2-1 and 2-2 can be positioned into alignment with each other with reduced difficulty, as with the first through third embodiments.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a stacked wafer assembly of two wafers each having a face side on which a plurality of devices each having at least one electrode are formed in a plurality of areas demarcated by a grid of projected dicing lines on the face side, including the steps of:
   preparing two wafers;
   forming a grid of grooves corresponding to said projected dicing lines in a face or reverse side of each of said two wafers, thereby forming demarcated areas demarcated by said grooves on said face or reverse side of each of said two wafers;
   installing one of said wafers with the demarcated areas formed on the face or reverse side thereof in place such that the demarcated areas face upwardly, and thereafter supplying a liquid to the demarcated areas of said one of the wafers in a quantity just enough to stay on upper surfaces of the demarcated areas without overflowing therefrom;
   placing the other of said wafers over said one of the wafers such that the demarcated areas of the other of said wafers face the respective demarcated areas of said one of the wafers which have been supplied with the liquid, thereby bringing respective central positions of the facing demarcated areas of the wafers into self-alignment with each other under the surface tension of the liquid sandwiched between the facing demarcated areas; and
   thereafter, removing the liquid to bring the other of said wafers into intimate contact with said one of the wafers.

2. The method of manufacturing a stacked wafer assembly according to claim 1, wherein said step of removing the liquid includes the step of installing limiters against outer circumferential surfaces of the wafers that have been superposed one over the other for thereby preventing the wafers from shifting in in-plane directions.

3. The method of manufacturing a stacked wafer assembly according to claim 1, wherein said step of removing the liquid includes the steps of charging the wafers that have been superposed one over the other into a decompression chamber, and evacuating said decompression chamber to reduce the pressure therein for evaporating the liquid.

4. The method of manufacturing a stacked wafer assembly according to claim 1, wherein each of said devices has a plurality of electrodes, and said step of removing the liquid includes the step of connecting the electrodes of said devices on said one of the wafers and the electrodes of said devices on the other of said wafers to each other.

* * * * *